United States Patent
Masuda et al.

(10) Patent No.: US 10,424,689 B2
(45) Date of Patent: Sep. 24, 2019

(54) METHOD OF MANUFACTURING SOLAR BATTERY

(71) Applicant: Toyota Jidosha Kabushiki Kaisha, Toyota-shi, Aichi-ken (JP)

(72) Inventors: Taizo Masuda, Yokohama (JP); Takashi Minemoto, Kusatsu (JP); Yutaka Niizawa, Kusatsu (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 0 days.

(21) Appl. No.: 16/013,379

(22) Filed: Jun. 20, 2018

(65) Prior Publication Data
US 2019/0027638 A1    Jan. 24, 2019

(30) Foreign Application Priority Data
Jul. 18, 2017  (JP) .................................. 2017-138835

(51) Int. Cl.
*H01L 21/00* (2006.01)
*H01L 31/18* (2006.01)
(Continued)

(52) U.S. Cl.
CPC .... *H01L 31/1896* (2013.01); *H01L 31/02167* (2013.01); *H01L 31/02366* (2013.01);
(Continued)

(58) Field of Classification Search
CPC .................................................. H01L 31/1896
(Continued)

(56) References Cited

U.S. PATENT DOCUMENTS

2010/0218827 A1* 9/2010 Aono .................... C25D 11/02
  136/264
2010/0236627 A1* 9/2010 Yago .................. H01L 31/0749
  136/261
(Continued)

FOREIGN PATENT DOCUMENTS

JP        07094765 A  *  4/1995
JP    2009-049389 A     3/2009
(Continued)

OTHER PUBLICATIONS

A. F. Pianezzi, et al., "Unveiling the effets of post-deposition treatment with different alkaline elements on the electronic properties of CIGS thin film solar cells", Physical Chemistry Chemical Physics 16 (2014), 8843-8851 (explained in the specification).

*Primary Examiner* — Ajay Arora
(74) *Attorney, Agent, or Firm* — Dinsmore & Shohl LLP

(57) ABSTRACT

A method of manufacturing a CIS solar battery includes preparing a layer-shaped member that is configured by a substrate, a first electrode layer, a CIS layer, and a second electrode layer; setting a temperature of the layer-shaped member to a second temperature that is lower than the first temperature; forming a layer of a layer forming substance having a higher linear expansion coefficient than the substrate in a solid state of the layer on the second electrode layer; and cooling the layer-shaped member. In the method, a thin-film CIS solar battery is acquired by peeling the CIS layer from the first electrode layer along with contraction of the layer of the layer forming substance caused by the cooling of the layer-shaped member.

9 Claims, 6 Drawing Sheets

(51) Int. Cl.
*H01L 31/0216* (2014.01)
*H01L 31/0224* (2006.01)
*H01L 31/0236* (2006.01)
*H01L 31/0392* (2006.01)

(52) U.S. Cl.
CPC ........... *H01L 31/022425* (2013.01); *H01L 31/022466* (2013.01); *H01L 31/03928* (2013.01)

(58) Field of Classification Search
USPC ........................................................ 438/57
See application file for complete search history.

(56) References Cited

U.S. PATENT DOCUMENTS

| | | |
|---|---|---|
| 2011/0023963 A1 | 2/2011 | Ishizuka et al. |
| 2015/0122331 A1 | 5/2015 | Kuroda et al. |

FOREIGN PATENT DOCUMENTS

| | | |
|---|---|---|
| JP | 2010-532576 A | 10/2010 |
| JP | 2013-171876 A | 9/2013 |
| JP | 2017-038069 A | 2/2017 |
| WO | 2009/005825 A1 | 1/2009 |
| WO | 2009/116626 A1 | 9/2009 |

* cited by examiner

METHOD OF MANUFACTURING SOLAR BATTERY

CROSS-REFERENCE TO RELATED APPLICATIONS

This application claims priority to Japanese Patent Application No. 2017-138835 filed on Jul. 18, 2017, which is incorporated herein by reference in its entirety including the specification, drawings and abstract.

BACKGROUND

1. Technical Field

The present disclosure relates to a method of manufacturing a solar battery, and more specifically, to a method of manufacturing a flexible thin-film CIS solar battery with high efficiency.

2. Description of Related Art

The ability to manufacture a flexible thin-film solar battery is useful in that the solar battery can be installed in any location such as the surface of an automobile or an airplane where installation has been difficult. As the solar battery that can be produced as a thin film and has a possibility of being manufactured with high efficiency at a low cost, a CIS solar battery (a solar battery mainly composed of three elements of Cu, In, and Se), a CIGS solar battery (a solar battery mainly composed of four elements of Cu, In, Ga, and Se), or a CIGSSe solar battery (a solar battery mainly composed of five elements of Cu, In, Ga, S, and Se) is focused and is a strong candidate for a solar battery replacing the currently mainstream silicon-based solar battery. For the CIS solar battery, for example, in WO 2009/116626 or A. F. Pianezzi, et al., Physical Chemistry Chemical Physics 16 (2014), 8843-8851, manufacturing a thin-film solar battery by forming a CIS thin film on a flexible polyimide resin film as a substrate is proposed. A method of manufacturing a flexible solar battery by forming a water-soluble lift-off layer on a glass substrate, forming a solar battery layer on the lift-off layer, and then, removing the lift-off layer by dissolving the lift-off layer in water is proposed in Japanese Unexamined Patent Application Publication No. 2009-049389 (JP 2009-049389 A). A method of manufacturing a relatively flexible solar battery by forming an anodic oxide film on a surface part of an Al-based plated layer of a hot-dip Al-based plated steel plate, and forming a CIS solar battery layer on the steel plate subjected to such surface processing as a substrate is proposed in Japanese Unexamined Patent Application Publication No. 2013-171876 (JP 2013-171876 A). A method of acquiring a flexible solar battery, though not a CIS solar battery, by disposing a sacrificial layer between a substrate for manufacturing a solar battery and an III-V compound thin-film solar battery manufactured on the substrate, after the manufacturing of the solar battery, immersing the solar battery in a special solution that chemically dissolves only the sacrificial layer, and peeling the III-V compound thin-film solar battery from the substrate is proposed in Japanese Unexamined Patent Application Publication (Translation of PCT Application) No. 2010-532576 (JP 2010-532576 A). Using a thermally contractible resin as a sheet for sealing a solar battery cell is disclosed in Japanese Unexamined Patent Application Publication No. 2017-038069 (JP 2017-038069 A).

SUMMARY

A high-quality CIS solar battery is produced by forming a CIS layer on a glass substrate under a high temperature condition of 450° C. or higher. However, when a flexible resin film or a thin gold plate is used as a substrate for acquiring a flexible thin-film solar battery, a problem arises in that under a high temperature condition, the substrate may melt, or steel component elements may diffuse to the CIS layer. Thus, the temperature at the time of formation of the CIS layer has to be decreased, and consequently, the performance of the solar battery such as its conversion efficiency may be decreased. For example, in WO 2009/116626 and A. F. Pianezzi, et al., Physical Chemistry Chemical Physics 16 (2014), 8843, while a polyimide resin film that is relatively thermally resistant is used as a substrate, the temperature at the time of formation of the CIS layer cannot be increased to 450° C. or higher, and the conversion efficiency of the solar battery is lower than that in a case where layer formation is performed on the glass substrate under a condition of 450° C. or higher. The polyimide resin film has a higher linear expansion coefficient than glass or metal, and thus the amount of deformation of the polyimide resin film is large when a temperature changes between a high temperature and a low temperature. Thus, the following problems may arise. The solar battery may be damaged when the temperature is set to room temperature again. The solar battery has high vapor permeability and cannot be used outdoors (low durability). The solar battery needs a special ingredient or manufacturing method and thus, is expensive. Since the formation of the CIS layer under a low temperature condition increases the manufacturing time and needs an additional step, cost is increased, and the facility cannot be used for other purposes. When the method of forming the lift-off layer or the sacrificial layer and dissolving the lift-off layer or the sacrificial layer after the formation of the CIS layer is used as in JP 2009-049389 A and JP 2010-532576 A, a long manufacturing time is taken for forming the lift-off layer or the sacrificial layer and dissolving the lift-off layer or the sacrificial layer, and cost is increased. In JP 2013-171876 A, since a thin steel plate is used as a substrate, flexibility is limited, and effort is needed to produce the hot-dip Al-based plated steel plate on which the anodic oxide film is formed. In conclusion, there is room for improvement in the method of manufacturing a flexible thin-film CIS solar battery in the related art due to a decrease in the efficiency of the solar battery and in terms of time, effort, and cost of the manufacturing step.

The disclosure provides a method of manufacturing a thin-film CIS solar battery, and a new method of acquiring a solar battery having approximately the same performance as that in a case where a CIS layer is formed on a glass substrate under a high temperature condition of 450° C. or higher, as a sufficiently flexible thin film, and furthermore, reducing the time, effort, and cost of a manufacturing step compared to those in the related art.

The disclosure provides a method of manufacturing a thin-film CIS solar battery, and also a new method that enables mass-production of a thin-film CIS solar battery.

An aspect of the disclosure relates to a method of manufacturing a CIS solar battery. The method includes preparing a layer-shaped member that is configured by forming a first electrode layer on a substrate thermally resistant to a first temperature or higher, forming a CIS layer on the first electrode layer under a condition of the first temperature or higher, and forming a second electrode layer on the CIS layer; setting a temperature of the layer-shaped member to a second temperature that is lower than the first temperature; forming a layer of a layer forming substance having a higher linear expansion coefficient than the substrate in a solid state of the layer on the second electrode layer; and cooling the layer-shaped member. In the method, a thin-film CIS solar battery is acquired by peeling the CIS layer from the first electrode layer along with contraction of the layer of the layer forming substance caused by the cooling of the layer-shaped member.

In the method according to the aspect of the disclosure, the forming of the layer of the layer forming substance may include applying the layer forming substance which is in a liquid state onto the second electrode layer, the layer forming substance applied to the second electrode layer having a layer shape, and solidifying the layer forming substance which is in the liquid state.

The method according to the aspect of the disclosure may further include making a cut perpendicular to a layer direction in the layer-shaped member before or after the cooling of the layer-shaped member such that the thin-film CIS solar battery has a desired dimension.

The method according to the aspect of the disclosure may further include applying a third electrode layer to a surface of the CIS layer of the thin-film CIS solar battery peeled from the first electrode layer.

In the method according to the aspect of the disclosure, the third electrode layer may be formed using a carbon paste.

In the method according to the aspect of the disclosure, the first temperature may be 450° C.

In the method according to the aspect of the disclosure, the substrate may be glass.

In the method according to the aspect of the disclosure, the layer forming substance may be a resin material.

In the method according to the aspect of the disclosure, the resin material may be an epoxy resin.

In the method according to the aspect of the disclosure, as described above, the "CIS solar battery" is a solar battery that uses a CIS layer (a layer mainly composed of three elements of Cu, In, and Se), a CIGS layer (a layer mainly composed of four elements of Cu, In, Ga, and Se), or a CIGSSe layer (a layer mainly composed of five elements of Cu, In, Ga, S, and Se) as a photovoltaic conversion layer as known in the present technical field (hereinafter, the term "CIS layer" includes the CIGS layer and the CIGSSe layer). The "layer-shaped member" refers to a member that is obtained by stacking the substrate, the first electrode layer, the CIS layer, and the second electrode layer in order in the same manner as the manufacturing of the CIS solar battery in the related art. More precisely, a buffer layer (a cadmium sulfide (CdS) layer or the like) and a window layer (a high-resistance zinc oxide layer or the like) are formed between the CIS layer and the second electrode layer. The "second electrode layer" is typically a transparent electrode that transmits sunlight. The "layer forming substance" may be any substance as long as the substance forms a layer having a higher linear expansion coefficient than the substrate which is in the solid state. Specifically, the layer forming substance may be a resin material such as an epoxy resin, but is not limited thereto.

According to the aspect of the disclosure, first, the layer-shaped member may be prepared in the same manner as the method of manufacturing the CIS solar battery in the related art. That is, the layer-shaped member as the base of the solar battery may be prepared under a condition in which a high-quality CIS layer can be formed. As described above, a high-quality CIS layer is formed under a temperature condition of 450° C. or higher. Thus, in the method according to the aspect of the disclosure, the condition of the first temperature or higher at the time of formation of the CIS layer may be 450° C. or higher, for example, 450° C. to 650° C. A substrate formed of any material thermally resistant to the first temperature or higher, typically, a thermally resistant glass substrate or metal substrate, may be used as the substrate. In the method of manufacturing the CIS solar battery through which a high-quality CIS layer is acquired in the related art, a protective glass layer is applied on the second electrode layer after the second electrode layer is stacked on the layer-shaped member. However, in the method according to the aspect of the disclosure, as described above, the layer of the layer forming substance is formed in a state where the layer-shaped member is heated to the second temperature lower than the first temperature. As described above, a substance having a higher linear expansion coefficient than the substrate which is in the solid state is selected as the layer forming substance. Thus, when the cooling of the layer-shaped member is executed after the forming of the layer of the layer forming substance, the layer of the layer forming substance contracts further than the substrate as will be described in "DETAILED DESCRIPTION OF EMBODIMENTS". Accordingly, an internal stress is generated in the layer of the layer forming substance, and due to the internal stress, a force that causes bending in a direction away from the substrate acts on the CIS layer. The first electrode layer is typically a layer formed of molybdenum, and the adhesion strength between the first electrode layer and the CIS layer is generally low. Thus, the boundary between the first electrode layer and the CIS layer is naturally peeled, and the layer of the layer forming substance—the second electrode layer—the CIS layer are separated, as a single thin film, from the first electrode layer—the substrate. Then, the thin-film CIS solar battery is acquired. That is, the thin-film CIS solar battery in a state where the CIS layer is formed with high quality under a temperature condition of 450° C. or higher and does not adhere to the hard substrate such as a glass substrate or a metal substrate is manufactured. When the layer forming substance is an epoxy resin and the substrate is a glass substrate, the second temperature may be approximately 100° C. to 150° C., and the layer-shaped member, for example, may be cooled to room temperature in the cooling of the layer-shaped member. However, it should be noted that the second temperature and the temperature of the layer-shaped member after the cooling may be appropriately set by comparing the linear expansion coefficients of the material selected as the layer forming substance and the material selected as the substrate.

In the method according to the aspect of the disclosure, the layer forming substance may be a substance that is originally in a melted state or a liquid state and forms a layer-shaped structure by coagulation or solidification using any method after being applied onto the second electrode layer. For example, the layer forming substance may be a substance that is in a melted state at a temperature higher than the second temperature and is coagulated at the second temperature. Alternatively, for example, the layer forming substance may be a substance such as a resin (an epoxy resin or the like) that is originally in a liquid state acquired by mixing two liquids and is solidified when heated to the second temperature. By applying the layer forming substance originally in a melted state or a liquid state onto the second electrode layer, a stress is not generated in the layer of the layer forming substance in the stage of disposing the layer of the layer forming substance on the second electrode layer. Accordingly, a situation where a stress is caused in an unintended direction in the structure below the second electrode layer before the fixed layer of the layer forming substance is stably formed is suppressed. In the cooling of the layer-shaped member, the peeling between the first electrode layer and the CIS layer is more appropriately achieved. Accordingly, the forming of the layer of the layer forming substance may be achieved by the applying of the layer forming substance in a liquid state onto the second electrode layer in a layer shape, and the solidifying of the layer forming substance in the liquid state.

In the method of manufacturing the solar battery according to the aspect of the disclosure, one surface of the thin film of the CIS layer peeled from the first electrode layer has an electrode. Thus, the thin-film CIS solar battery may be completed by executing the applying of the third electrode layer to the surface of the CIS layer of the thin-film CIS solar battery peeled from the first electrode layer. Any substance having conductivity and flexibility may be used as the third electrode layer. For example, the third electrode layer may be formed using a carbon paste.

Furthermore, in order to achieve the peeling of the layer of the layer forming substance—the second electrode layer—the CIS layer from the first electrode layer—the substrate in a desirable manner, the making of a cut perpendicular to the layer direction in the layer-shaped member such that the thin-film CIS solar battery having a desired dimension is acquired may be executed before or after the cooling of the layer-shaped member. By making such a cut in the layer-shaped member, the natural peeling between the CIS layer and the first electrode layer is promoted, and subsequent processing of the thin film formed of the separated layer of the layer forming substance—the second electrode layer—the CIS layer is facilitated.

In the method of manufacturing the CIS solar battery according to the aspect of the disclosure, the same steps as the method of manufacturing the CIS solar battery in the related art using a durable substrate under a high temperature condition are executed until the second electrode layer is formed. Then, the layer of the layer forming substance having a higher linear expansion coefficient than the substrate is applied onto the second electrode layer, and the CIS layer and the first electrode layer are peeled from each other using the difference in the degree of contraction between the substrate and the layer of the layer forming substance. Then, the thin-film CIS solar battery is acquired. With such a configuration, the CIS layer is formed under a temperature condition of 450° C. or higher. Accordingly, a high-quality CIS layer is acquired. In addition, since the CIS layer is separated from the hard substrate, the solar battery is acquired as a thin-film member having sufficient flexibility. In actuality, as will be described below, the performance of the solar battery formed of the CIS layer that is peeled using the method of manufacturing the solar battery according to the aspect of the disclosure does not have a decrease in short-circuit current and open-circuit voltage, compared to the solar battery that is not peeled from the substrate. In the method of manufacturing the solar battery according to the aspect of the disclosure, the same steps as the method of manufacturing the CIS solar battery using a hard substrate in the related art are executed, and then, the thin-film CIS solar battery is acquired by forming the layer of the layer forming substance such as an epoxy resin and performing the cooling. Thus, a special resin, steel plate, or step is not needed. The time, effort, and cost needed for the manufacturing steps are reduced compared to that in the method of manufacturing the thin-film CIS solar battery in the related art. The thin-film CIS solar battery can also be mass-produced.

Other objects and advantages of the disclosure will become apparent from an exemplary embodiment set forth below.

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 2C is a graph illustrating an example of voltage-current characteristics of the CIS solar battery (before peeling) formed on the glass substrate and the CIS solar battery (after peeling) formed of the thin film peeled from the glass substrate;

DETAILED DESCRIPTION OF EMBODIMENTS

Figure 1:
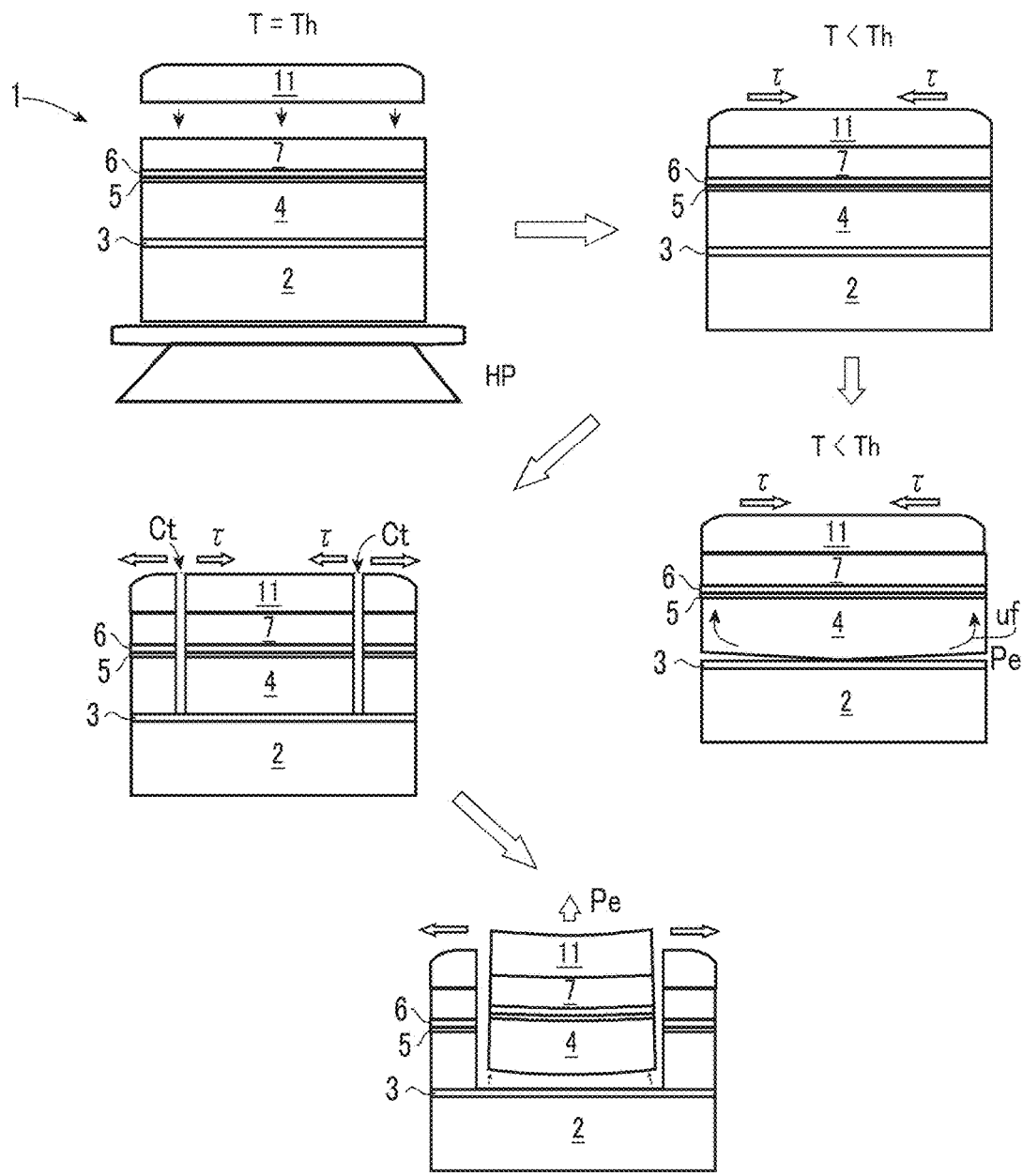
FIG. 1 is a diagram schematically illustrating steps of acquiring a thin film as a CIS solar battery (CIS solar battery thin film) from a layer-shaped member obtained by forming an electrode layer, a CIS layer, and the like on a glass substrate, according to an embodiment, in which a first step is a step of forming a resin layer on the layer-shaped member in a state where the layer-shaped member is heated to a temperature T=Th, a second step is a step of cooling the layer-shaped member to the temperature T<Th after the formation of the resin layer, a third step is a state where the CIS solar battery thin film is peeled from the glass substrate, a fourth step is a step of making a cut perpendicular to a layer direction in the layer-shaped member, and a fifth step is a state where the CIS solar battery thin film is peeled from the glass substrate.

Hereinafter, an exemplary embodiment will be described in detail with reference to the appended drawings. In the drawings, the same reference signs denote the same parts.

Configuration of General CIS Solar Battery

Figure 6:
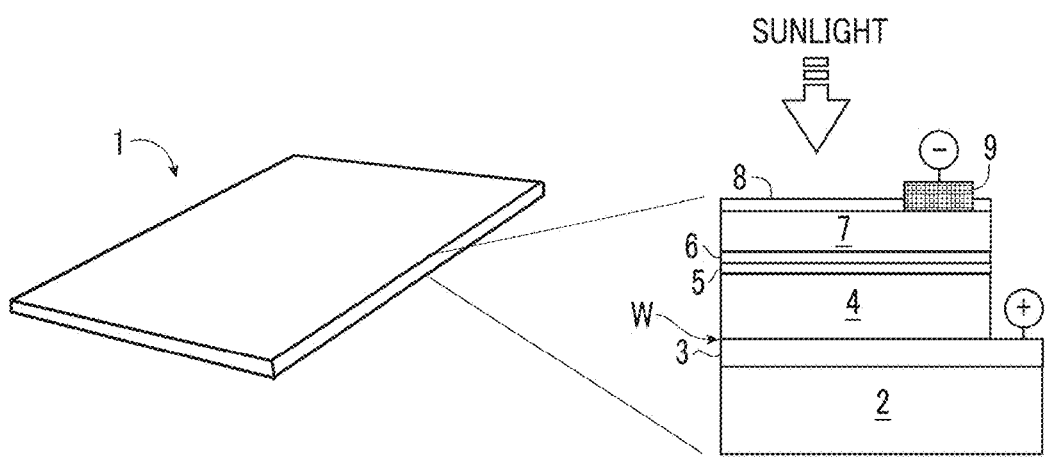
FIG. 6 is a schematic perspective view of the CIS solar battery formed on a general hard substrate in a left part, and a diagram schematically illustrating a section of the CIS solar battery formed on the general hard substrate in a right part.

With reference to FIG. 6, a CIS solar battery 1 for which a mass production step is established is generally manufactured in the form of a thin plate as illustrated. In a section of the thin plate form, a glass plate or a metal plate is used as a substrate 2, and typically, a molybdenum electrode layer 3

(first electrode layer), a compound semiconductor layer (CIS layer) 4 mainly formed of copper (Cu), indium (In) (or including gallium (Ga)), and selenium (Se), a buffer layer 5 (typically, a layer formed of CdS), a window layer 6 (typically, a layer formed of zinc oxide), a transparent electrode layer 7 (typically, a layer formed of a conductive substance, such as indium tin oxide, a zinc oxide-based material, or the like) (second electrode layer), and an anti-reflective film 8 are stacked on the substrate 2. A grid electrode 9 is disposed on a part of the transparent electrode layer 7. When the CIS solar battery 1 is irradiated with the sunlight from the upper side (anti-reflective film 8 side) in FIG. 6, electric power is generated in the CIS layer 4, and the voltage and the current are acquired from terminals attached to the electrode layer 3 and the transparent electrode layer 7, respectively. Regarding the manufacturing of the CIS solar battery 1 having such a stacked structure, it is known that when a step of forming the CIS layer is performed under a temperature condition of 450° C. or higher, typically, in a range of 450° C. to 650° C., a high-quality solar battery, specifically, a solar battery having a high conversion efficiency, is acquired. Therefore, glass or metal that is thermally resistant to a high temperature of 450° C. or higher is selected as described above, as the material of the substrate 2 for the CIS layer 4. Accordingly, in the related art, as described in "SUMMARY", a high-quality CIS layer itself is formed as a thin film, but is formed on a hard substrate as the solar battery.

Formation of Thin-Film CIS Solar Battery in Embodiment

In the embodiment of the present disclosure, simply speaking, similar to the method of manufacturing the CIS solar battery in the related art, the electrode layer 3 and the CIS layer 4 to the transparent electrode layer 7 are formed in the method of executing the step of forming the CIS layer 4 under a high temperature condition of 450° C. or higher using a glass plate or a metal plate as the substrate 2 for forming the CIS layer 4. Subsequently, in the related art, the step of bonding a protective glass by applying the anti-reflective film 8 is executed, but in the embodiment, a step of forming a thin-film CIS solar battery by peeling the layers above the CIS layer 4 from the electrode layer 3 is executed.

Figure 2A:
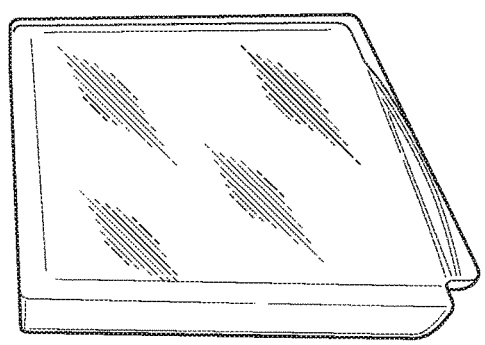
FIG. 2A is a picture of an example in which a transparent resin layer 11 is formed on the layer-shaped member.

More specifically, with reference to FIG. 1, in the method of manufacturing a CIS solar battery according to the embodiment, first, a layer-shaped member 1 in which the electrode layer 3 to the transparent electrode layer 7 are formed on the substrate 2 is prepared as described above in the method of executing the step of forming the CIS layer 4 under a high temperature condition of 450° C. or higher using a glass plate or a metal plate as the substrate 2. Then, as illustrated in a first step in FIG. 1, the layer-shaped member 1 is heated to a temperature T=Th, for example, 100° C. to 150° C., using a hotplate or oven HP or the like. In such a state, for example, a layer 11 (hereinafter, referred to as a "resin layer") of a substance (layer forming substance) that forms a layer of transparent resin material or the like having a higher linear expansion coefficient than the substrate 2 is formed. FIG. 2A illustrates a picture of the actual layer-shaped substance in a state where the resin layer 11 is lastly formed. Desirably, the resin layer 11 may be applied in a liquid state and then, solidified to form a solid layer. Then, as in a second step in FIG. 1, when the layer-shaped member 1 is cooled such that the temperature T<Th is satisfied, for example, to room temperature, due to the difference in linear expansion coefficient, the contraction amount of the resin layer 11 is greater than that of the substrate 2, and thus an internal stress r is generated in a direction in which the area of the resin layer 11 is reduced. The adhesion strength at a boundary between the electrode layer 3 and the CIS layer 4 is relatively low. Thus, as in a third step in FIG. 1, a force uf that causes the CIS layer 4 and the layers above to bend upward in FIG. 1 is generated from the internal stress τ, and the layers are naturally peeled (Pe) from the electrode layer 3 and the substrate 2. Therefore, a thin film of the CIS layer 4 to the transparent electrode layer 7 that are not fixed to the substrate 2 is acquired.

Figure 2B:
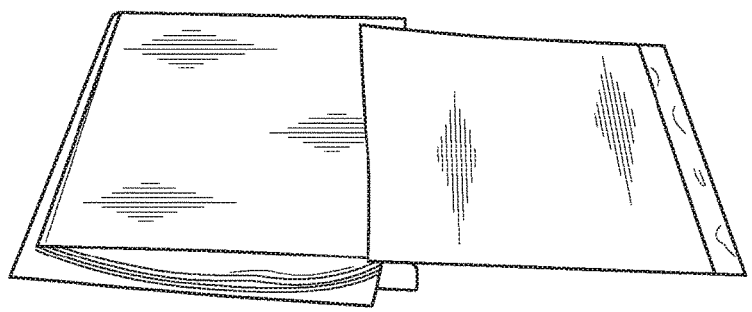
FIG. 2B is a picture of an example of the glass substrate on which an electrode surface is bonded, and the CIS solar battery thin film peeled from the glass substrate.

The peeling between the electrode layer 3 and the CIS layer 4 occurs even in a state where the electrode layer 3 to the transparent electrode layer 7 and the resin layer 11 are formed on approximately the entire area of the substrate 2 as in the second and third steps in FIG. 1. However, when a cut Ct is made from the resin layer 11 to the CIS layer 4 on the substrate 2 in a direction perpendicular to the extending direction of each layer as in a fourth step in FIG. 1, it is useful that the peeling between the electrode layer 3 and the CIS layer 4 can be facilitated as in a fifth step in FIG. 1 (when the cut Ct is made, the peeling easily occurs because the total binding force between the electrode layer 3 and the CIS layer 4 in a region surrounded by the cut Ct is decreased). The cut Ct may be made such that the thin film of the CIS layer 4 to the resin layer 11 to be peeled off has desired shape and dimension. FIG. 2B illustrates a picture of an example in which the thin film of the CIS layer 4 to the resin layer 11 is naturally peeled by making a cut into a size of 2 cm×2 cm in a state where the resin layer 11 is formed on the substrate 2. The cut Ct may be made in a state where the layer-shaped member 1 is heated to the temperature T=Th, or may be made in a state where the layer-shaped member 1 is cooled to the temperature T<Th.

A rear surface electrode that corresponds to the electrode layer 3 is not present in the thin film of the CIS layer 4 to the resin layer 11. Thus, a new electrode layer is formed on the peeled surface of the CIS layer 4, and in this manner, a thin-film CIS solar battery is completed. A layer of a flexible conductive substance such as a carbon paste is selected as the new electrode layer. In the voltage-current characteristic of the thin-film CIS solar battery acquired as described above, an open-circuit voltage Voc and a short-circuit current Isc of the thin-film CIS solar battery are approximately equal to those of the CIS solar battery fixed on the substrate 2 as illustrated in FIG. 2C. Accordingly, it is confirmed that the performance of the acquired thin-film CIS solar battery is approximately the same as the CIS solar battery fixed on the substrate 2.

Embodiment of Manufacturing Thin-Film CIS Solar Battery

Figure 3:
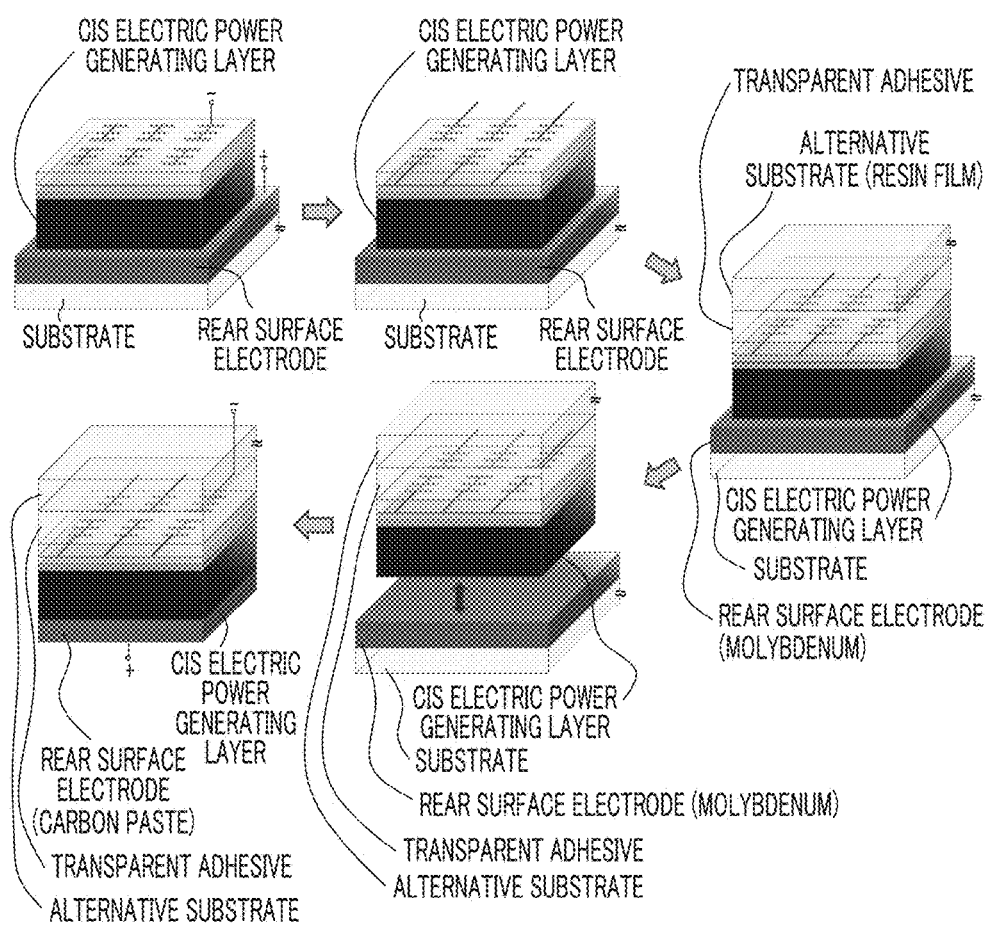
FIG. 3 is a diagram schematically illustrating steps of the embodiment of acquiring the CIS solar battery thin film from the CIS solar battery formed on the glass substrate and forming a flexible electrode (carbon paste) on the peeled CIS layer surface in the same manner as FIG. 1.
Figure 4A:
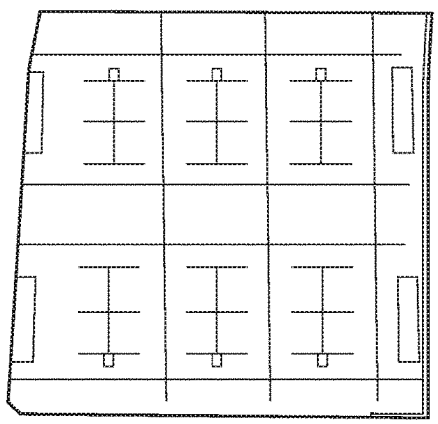
FIG. 4A is a picture of an example in the state of a first step in FIG. 3.
Figure 4B:
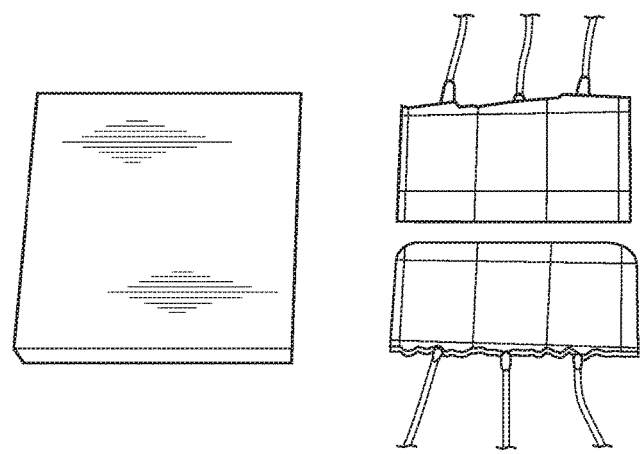
FIG. 4B is a picture of an example of the glass substrate (left) and the CIS solar battery thin film (right) in the state of a fourth step in FIG. 3.
Figure 4C:
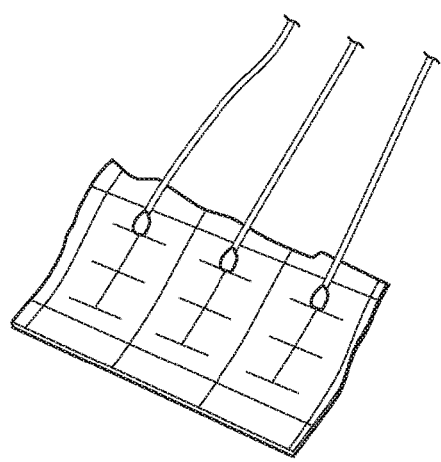
FIG. 4C is a picture of an example of the thin-film CIS solar battery in the state of a fifth step in FIG. 3.

With reference to FIG. 3 and FIG. 4A to FIG. 4C, in the embodiment of manufacturing the thin-film CIS solar battery, a CIS solar battery (layer-shaped member) in a state where a rear surface electrode formed of molybdenum, and a CIS electric power generating layer (CIS layer) to a transparent electrode are stacked on a hard solid substrate such as a glass plate or a metal plate is prepared as illustrated in a first step in FIG. 3 and FIG. 4A. The CIS solar battery on the substrate is heated to, for example, 150° C. (second step in FIG. 3). A transparent thermosetting epoxy resin (transparent adhesive) that is not hardened yet is applied to the CIS solar battery at a thickness of, for example, 0.5 mm. A resin film (alternative substrate) that protects the surface is applied onto the resin. In such a state, the heating state is maintained for 15 minutes, and the resin is hardened (third step in FIG. 3). Then, when the entire CIS solar battery in such a state is cooled to room temperature, and a cut having a desired size is made in the CIS solar battery, a "stress causing upward bending" is generated in the epoxy resin layer due to the epoxy resin layer having a higher linear expansion coefficient than the substrate. Thus, the CIS electric power generating layer and the rear surface electrode are naturally peeled from each other as illustrated in a fourth step in FIG. 3 and FIG. 4B. A thin-film CIS solar battery is acquired as illustrated in a fifth step in FIG. 3 and FIG. 4C by applying a carbon paste as an electrode to the peeled surface of the CIS electric power generating layer.

Mass Production of Thin-Film CIS Solar Battery

When the thin-film CIS solar battery is mass-produced, the series of steps of stacking the rear surface electrode layer 3 to the transparent electrode layer 7 on the hard substrate 2 such as glass as illustrated above is executed in the same manner as the method of executing the step of forming the CIS layer 4 under a high temperature condition of 450° C. or higher in the related art. Then, instead of the glass layer protecting the surface of the solar battery, the layer of the substance forming a layer of transparent resin material or the like is applied to the surface, the rear surface electrode layer 3 and the CIS layer 4 are peeled from each other, and thus the thin-film CIS solar battery is acquired.

Figure 5:
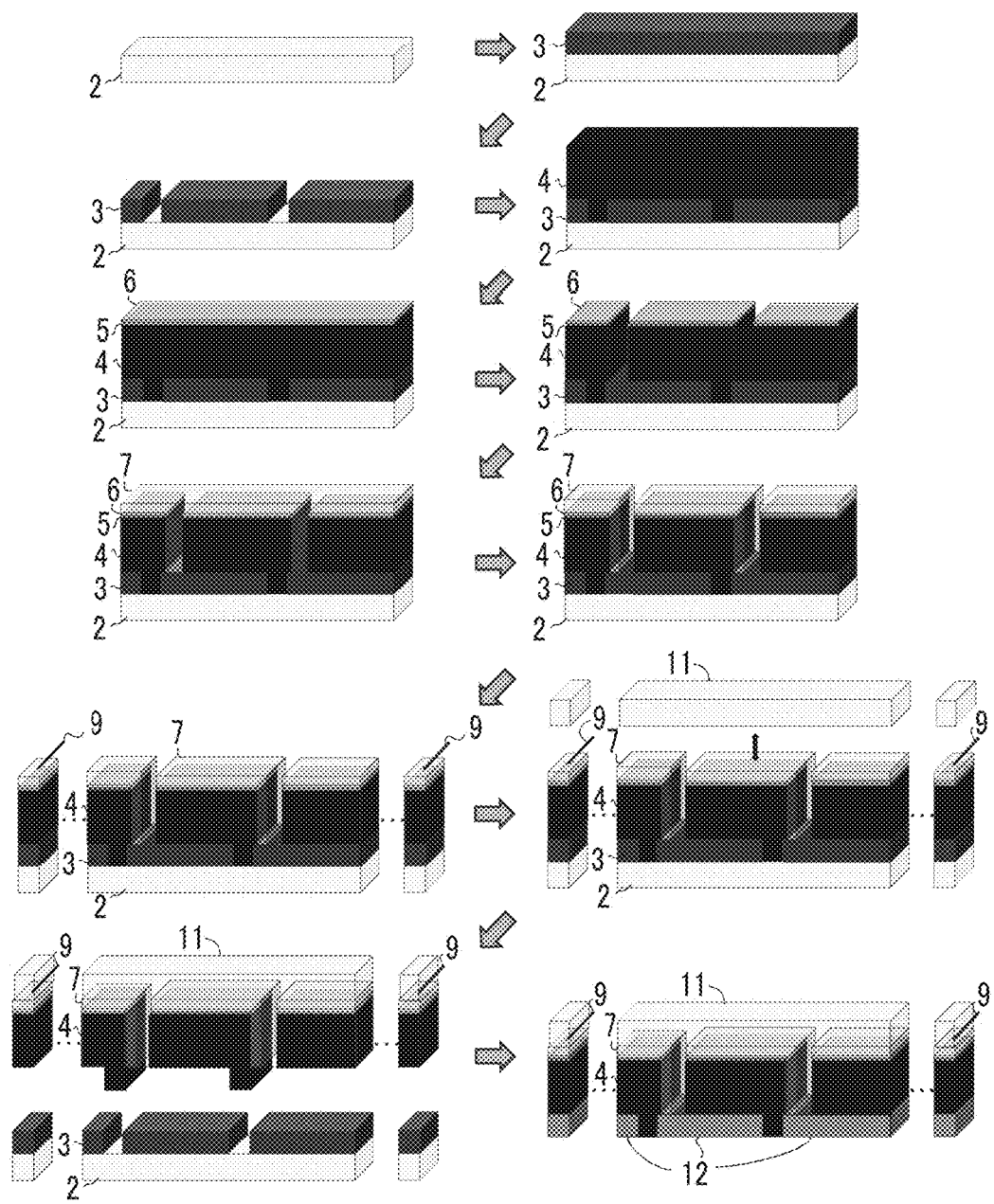
FIG. 5 is a diagram schematically illustrating a series of steps when the thin-film CIS solar battery according to the embodiment is mass-produced.

Specifically, with reference to FIG. 5, first, the glass substrate 2 is cut and washed (first step in FIG. 5), and the rear surface electrode layer 3 is formed using molybdenum or the like (second step in FIG. 5). The original patterning of solar battery cells is executed by laser scribing (third step in FIG. 5), and the CIS layer 4 as an electric power generating layer is formed on the patterned rear surface electrode layer 3 under a high temperature condition of 450° C. or higher (fourth step in FIG. 5). Then, the buffer layer 5 and the window layer 6 are formed on the CIS layer 4 (fifth step in FIG. 5), and the patterning of solar battery cells is executed again by mechanical scribing (sixth step in FIG. 5). Furthermore, the transparent electrode layer 7 is formed (seventh step in FIG. 5), and the patterning of solar battery cells (eighth step in FIG. 5) is executed by mechanical scribing. The extraction electrode 9 is formed on the transparent electrode layer 7 (ninth step in FIG. 5). The steps heretofore are the same as those in the method of forming a CIS solar battery on a substrate in the related art. Then, the resin layer 11 is formed as a surface protective film on the transparent electrode layer 7 while being heated (tenth step in FIG. 5). Then, as described above, when the resin layer 11 is cooled, the CIS layer 4 and the rear surface electrode layer 3 are peeled from each other due to the internal stress generated in the resin layer 11, as schematically illustrated in an eleventh step in FIG. 5. Thus, a new rear surface electrode layer 12 is formed on the peeled surface of the CIS layer 4 to form the thin-film CIS solar battery (twelfth step in FIG. 5). Since a flexible material can be used for the rear surface electrode layer 12, the entire thin-film CIS solar battery can have flexibility.

As described above, in the method of manufacturing a thin-film CIS solar battery according to the embodiment, the step of stacking the rear surface electrode layer 3 to the transparent electrode layer 7 on the substrate 2 is the same as the step for manufacturing a high-quality CIS solar battery in the related art, and after the step, each step of applying the resin layer 11, peeling the CIS layer 4, and applying the rear surface electrode layer 12 is simply executed. Thus, the time, effort and cost needed for manufacturing the CIS solar battery are expected to be approximately the same as those in the method of manufacturing a high-quality CIS solar battery in the related art.

With the method of manufacturing a thin-film CIS solar battery according to the embodiment, it is possible to reuse the substrate after the CIS layer is peeled. Accordingly, the cost of the entire solar battery can be reduced. Any resin material can be used for the resin layer 11 as long as the resin material has a higher linear expansion coefficient than the substrate or the CIS layer. The resin material can be selected from a very wide range of materials, and the range may be changed depending on the situation such as the application and cost (the manufacturing steps do not need to be changed). When a thin-film CIS solar battery is acquired by peeling the CIS layer 4 to the transparent electrode layer 7 from the substrate 2 and the rear surface electrode layer 3, the thin film of the CIS solar battery can have desired size and shape. Accordingly, it is useful that the size and shape of a solar battery module can be freely customized depending on the area or size of an installation location.

While the above description is related to the embodiment, various modifications and changes can be easily carried out by those skilled in the art.

What is claimed is:

1. A method of manufacturing a CIS solar battery, the method comprising:
    preparing a layer-shaped member that is configured by forming a first electrode layer on a substrate thermally resistant to a first temperature or higher, forming a CIS layer on the first electrode layer under a condition of the first temperature or higher, and forming a second electrode layer on the CIS layer;
    setting a temperature of the layer-shaped member to a second temperature that is lower than the first temperature;
    forming a layer of a layer forming substance having a higher linear expansion coefficient than the substrate in a solid state of the layer on the second electrode layer; and
    cooling the layer-shaped member,
    wherein a thin-film CIS solar battery is acquired by peeling the CIS layer from the first electrode layer along with contraction of the layer of the layer forming substance caused by the cooling of the layer-shaped member.

2. The method according to claim 1, wherein the forming of the layer of the layer forming substance includes
    applying the layer forming substance which is in a liquid state onto the second electrode layer, the layer forming substance applied on the second electrode layer having a layer shape, and
    solidifying the layer forming substance which is in the liquid state.

3. The method according to claim 1, further comprising making a cut perpendicular to a layer direction in the layer-shaped member before or after the cooling of the layer-shaped member such that the thin-film CIS solar battery has a desired dimension.

4. The method according to claim 1, further comprising applying a third electrode layer to a surface of the CIS layer of the thin-film CIS solar battery peeled from the first electrode layer.

5. The method according to claim 4, wherein the third electrode layer is formed using a carbon paste.

6. The method according to claim 1, wherein the first temperature is 450° C.

7. The method according to claim 1, wherein the substrate is glass.

8. The method according to claim 1, wherein the layer forming substance is a resin material.

9. The method according to claim 8, wherein the resin material is an epoxy resin.

\* \* \* \* \*

UNITED STATES PATENT AND TRADEMARK OFFICE
CERTIFICATE OF CORRECTION

| | |
|---|---|
| PATENT NO. | : 10,424,689 B2 |
| APPLICATION NO. | : 16/013379 |
| DATED | : September 24, 2019 |
| INVENTOR(S) | : Taizo Masuda, Takashi Minemoto and Yutaka Niizawa |

It is certified that error appears in the above-identified patent and that said Letters Patent is hereby corrected as shown below:

In the Specification

In Column 7, Line 67, after "stress", delete "r" and insert --τ--, therefor.

Signed and Sealed this
Twelfth Day of November, 2019

Andrei Iancu
*Director of the United States Patent and Trademark Office*